United States Patent [19]

Takano et al.

[11] Patent Number: 5,130,296
[45] Date of Patent: Jul. 14, 1992

[54] METHOD OF PREPARING AN OXIDE SUPERCONDUCTING THIN FILM ON A SUBSTRATE WITH A PLURALITY OF GROOVES

[75] Inventors: Satoshi Takano; Shigeru Okuda; Noriyuki Yoshida; Noriki Hayashi; Kenichi Sato, all of Osaka, Japan

[73] Assignee: Sumitomo Electric Industries, Ltd., Osaka, Japan

[21] Appl. No.: 677,700

[22] Filed: Mar. 29, 1991

[30] Foreign Application Priority Data

Mar. 29, 1990 [JP] Japan ................................. 2-83192

[51] Int. Cl.$^5$ ............................ B05D 5/12; B05D 3/06; B05D 3/10
[52] U.S. Cl. ........................................ 505/1; 505/732; 427/62; 427/53.1; 427/309
[58] Field of Search .................... 505/1, 732; 427/62, 427/63, 53.1, 54.1, 307, 309

[56] References Cited

FOREIGN PATENT DOCUMENTS

0291050A2 11/1988 European Pat. Off.
0339801 11/1989 European Pat. Off.
58-80829 5/1983 Japan.
02-260473 10/1990 Japan.

OTHER PUBLICATIONS

Venkatesan et al, "High-temperature superconductivity in ultra thin films of $Y_1Ba_2Cu_3O_{7-x}$", Appl. Phys. Lett. 54(6) Feb. 1989, pp. 581–583.

M. R. Beasley, "High-Temperature Superconductive Thin Film", Proceedings of the EEE, vol. 77, No. 8, Aug. 1989, pp. 1155–1163, New York, US.

J. H. Magerlin et al. "Control of Thin Film Grain Size by Lithographic Methods", IBM Technical Disclosure Bulletin, vol. 24, No. 4, Sep. 1981, pp. 1974–1975.

Primary Examiner—Shrive Beck
Assistant Examiner—Roy V. King
Attorney, Agent, or Firm—Pennie & Edmonds

[57] ABSTRACT

When an oxide superconducting thin film is formed on a substrate by a vapor phase method such as laser ablation, for example, a plurality of grooves are formed on the substrate by photolithography or beam application in the same direction with an average groove-to-groove pitch of not more than 10 $\mu$m, so that the oxide superconducting thin film is formed on a surface provided with such a plurality of grooves. Thus promoted is growth of crystals of the oxide superconducting thin film in parallel with the grooves, whereby respective directions of a-axes and c-axes are regulated to some extent. This improves critical current density of the oxide superconducting thin film.

5 Claims, 2 Drawing Sheets

METHOD OF PREPARING AN OXIDE SUPERCONDUCTING THIN FILM ON A SUBSTRATE WITH A PLURALITY OF GROOVES

BACKGROUND OF THE INVENTION

1. Field of the Invention

The present invention relates to a method of preparing an oxide superconducting thin film by a vapor phase method such as laser ablation, for example.

2. Description of the Background Art

In a typical example of a product which is prepared from an oxide superconductive material, such as an oxide superconducting wire, for example, an oxide superconducting thin film is formed on a suitable substrate, so that the oxide superconductive material is held by the substrate and shaped into a desired configuration.

In order to form such an oxide superconducting thin film on a substrate as described above, a vapor phase method, for example, is employed. Among various vapor phase methods, laser ablation has been watched with interest particularly in recent years, due to its capability of forming an oxide superconducting thin film under a low temperature at a high speed.

FIG. 3 illustrates a crystal lattice of an oxide superconducting thin film 2, which is formed on a substrate 1 by a vapor phase method. As shown in FIG. 3, it is relatively easy to perpendicularly orient the c-axes in the crystal lattice of the oxide superconducting thin film 2 with respect to the substrate 1. Such orientation of the c-axes is easily attained particularly by laser ablation.

On the other hand, FIGS. 4 and 5 are top plan views illustrating crystal lattices of the oxide superconducting thin film 2 shown in FIG. 3.

As to such an oxide superconducting thin film 2, it is known that current flows in a-b planes, which are parallel to the surface of the substrate 1. In order to enable feeding of large current in the oxide superconducting thin film 2, therefore, the directions of the a-axes and the b-axes may be regulated as shown in FIG. 4. In general, such a-axes and b-axes are arbitrarily inclined as shown in FIG. 5.

In relation to such an oxide superconducting thin film as shown in FIG. 5, it has been recognized that critical current density $J_c$ in a zero field as well as critical current density $J_c$-B under a magnetic field are reduced as inclination 3 between the a-axes of adjacent crystal lattices is increased in a range of 0° to 45°.

When the substrate 1 is formed of a polycrystalline material, the directions of the a-axes and the b-axes are easily irregularlized as compared with those of a single-crystalline substrate. In relation to this, it is necessary to use a long substrate having proper flexibility, in order to obtain an oxide superconducting wire by forming an oxide superconducting thin film on such a substrate. In general, it is difficult to provide a long flexible substrate by a single-crystalline material. In order to obtain a long flexible substrate, a polycrystalline material must be employed in general.

SUMMARY OF THE INVENTION

Accordingly, an object of the present invention is to provide a method of preparing an oxide superconducting thin film, which can regulate directions of a-axes and b-axes to the maximum on a polycrystalline substrate, thereby attaining high critical current density.

The present invention is characterized in that, in a method of preparing an oxide superconducting thin film by forming such an oxide superconducting thin film on a substrate through a vapor phase method, the substrate as used is provided with a plurality of grooves in the same direction on a surface to be formed with the oxide superconducting thin film, in order to solve the aforementioned technical problem.

When a long substrate is employed, the grooves are preferably formed to extend along the longitudinal direction of the substrate.

An average pitch between the plurality of grooves is preferably selected to be not more than 10 μm.

Preferably laser ablation is selected as the vapor phase method.

While it is possible to form the grooves by scoring the surface of the substrate with a knife edge, such grooves are preferably formed by photolithography or beam application, in particular.

When an oxide superconducting thin film is formed on such a substrate according to the present invention, its crystals are grown in parallel with the grooves, whereby the directions of the a-axes and c-axes are regulated to some extent.

Thus, according to the present invention, it is possible to regulate the directions of the a-axes and b-axes to some extent even if the substrate is formed of a polycrystalline material, whereby current flowable in the a-b planes can be increased. Therefore, it is possible to obtain an oxide superconducting thin film, which exhibits high critical current density $J_c$ in a zero field as well as high critical current density $J_c$-B under a magnetic field.

When a long substrate is employed and the grooves are formed to extend along the longitudinal direction of such a substrate, it is possible to obtain an oxide superconducting wire having excellent superconductive properties, which comprises an oxide superconducting thin film formed on the long substrate.

It is preferable to densely form the grooves in the narrowest possible width. Therefore, an average pitch between the plurality of grooves is preferably selected to be not more than 10 μm.

The vapor phase method employed for forming the oxide superconducting thin film is preferably carried out by laser ablation. According to such laser ablation, not only orientation of the c-axes is easily attained but the film can be formed at a higher speed. Therefore, when an oxide superconducting thin film must be continuously formed on a long substrate in order to obtain an oxide superconducting wire, for example, it is possible to advantageously form the oxide superconducting thin film in an efficient manner.

When the grooves are formed by photolithography or beam application, it is possible to define sharp internal angles at the bottom parts of the grooves. Such sharp internal angles promote regulation of the directions of the a-axes and the b-axes in crystal growth of the oxide superconducting thin film.

These and other objects, features, aspects and advantages of the present invention will become more apparent from the following detailed description of the present invention when taken in conjunction with the accompanying drawings.

DESCRIPTION OF THE PREFERRED EMBODIMENTS

Examples of oxide superconducting thin films, which were prepared by laser ablation according to an embodiment of the present invention, are now described.

EXPERIMENTAL EXAMPLE 1

An oxide superconducting thin film of $Y_1Ba_2Cu_3O_{7-\delta}$ was formed by laser ablation on a substrate of YSZ (yttria stabilized zirconia; Y: 6%) of 0.1 μm in particle size. The film forming conditions were as follows:
Laser: KrF (248 nm)
Energy Density: 2.3 J/cm$^2$
Repetition Rate: 5 Hz
Oxygen Pressure: 300 mTorr
Substrate Temperature: 750° C.
Target-to-Substrate Distance: 45 mm
Film Forming Rate: 33 Å/min.
Angle of Incidence of Laser Beam: 45°

The film was formed under the above conditions for 4 hours. The as-formed oxide superconducting thin film exhibited critical current density of 3400 A/cm$^2$ in a zero magnetic field.

On the other hand, grooves of 10 to 100 μm in width and 10 to 100 μm in depth were provided on a similar substrate in a groove-to-groove average pitch of 100 μm with a diamond cutter, and an oxide superconducting thin film was formed on this substrate under the same film forming conditions. This film exhibited critical current density of 15000 A/cm$^2$ in a zero magnetic field.

EXPERIMENTAL EXAMPLE 2

Grooves of various sizes and directions were formed on long substrates by photolithography or beam application. Then, oxide superconducting thin films were formed on such substrates under film forming conditions similar to those in Experimental Example 1. The following Table shows values of critical current density $J_c$ of the as-formed oxide superconducting thin films in zero magnetic fields.

| Method of Groove Formation | Direction | Pitch μm | Width μm | Depth μm | Jc A/cm$^2$ |
|---|---|---|---|---|---|
| Reactive Ion Etching | Longitudinal | 10 | 10 | 0.1 | 28000 |
| | Longitudinal | 5 | 5 | 0.1 | 56000 |
| | Cross | 5 | 5 | 0.1 | 41000 |
| Ion Beam Etching | Cross | 2 | 0.2 | 0.05 | 87000 |

Figure 1:
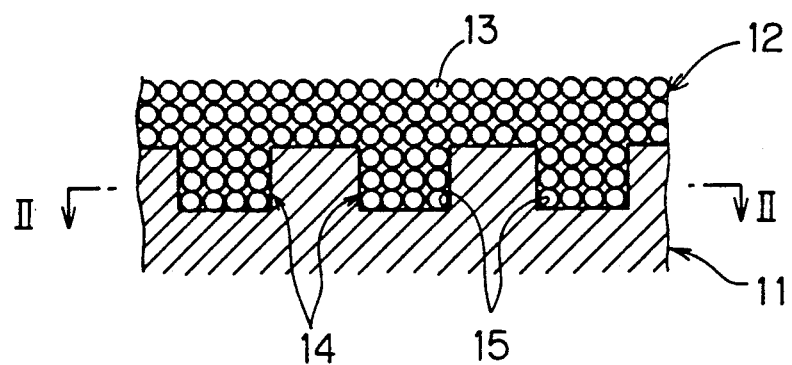
FIG. 1 is an enlarged sectional view showing a growth state of crystal grains 13 in an oxide superconducting thin film 12 which is formed on a substrate 11 according to the present invention in a model manner.
Figure 2:
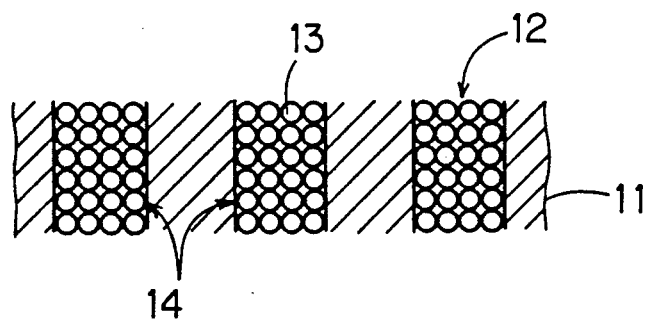
FIG. 2 is a sectional view taken along the line II—II in FIG. 1.
Figure 3:
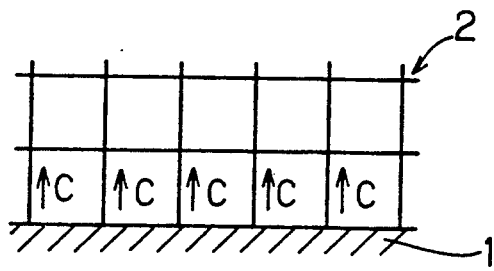
FIG. 3 is a sectional view illustrating a crystal lattice of an oxide superconducting thin film 2 which is formed on a substrate 1.

It is conceivable that, in relation to the substrates which were provided with the grooves according to the present invention, high critical current density values were obtained for the following reason:

FIG. 1 is an enlarged sectional view showing a growth state of crystal grains 13 in an oxide superconducting thin film 12, which is formed on a substrate 11 in accordance with the present invention, in a model manner. FIG. 2 is a sectional view taken along the line II—II in FIG. 1.

On a surface of the substrate 11 to be formed with the oxide superconducting thin film 12, a plurality of grooves 14 are provided in the same direction, in the form of stripes. While such grooves 14 can be formed by scoring the surface of the substrate 11 with a knife edge, it is possible to define sharper internal angle portions 15 by forming the grooves 14 through photolithography or beam application.

Figure 4:
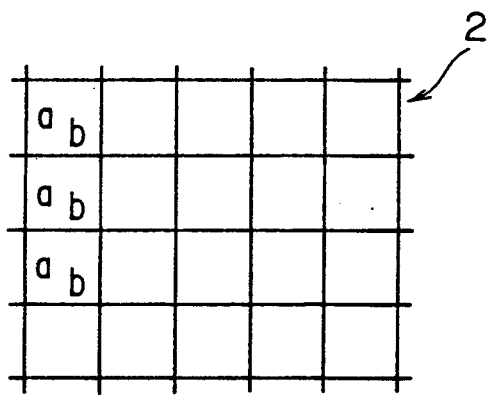
FIG. 4 is a top plan view illustrating the crystal lattice of the oxide superconducting thin film 2 shown in FIG. 3.
Figure 5:
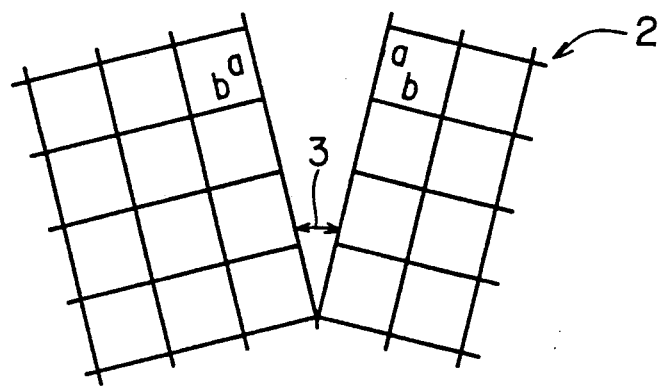
FIG. 5 is a top plan view corresponding to FIG. 4, illustrating typical examples of adjacent crystal lattices whose a-axes and b-axes are irregularized in an a-b plane.

When the oxide superconducting thin film 12 is formed on such a substrate 11, the crystal grains 13 are forced by the grooves 14 in an initial stage of crystal growth, to be aligned with respect to the grooves 14. Therefore, the directions of the a-axes and the b-axes substantially reach those of the ideal crystal lattice shown in FIG. 4. Thus, the crystal grains 13 are thereafter grown along such initial states, whereby the oxide superconducting thin film 12 can provide excellent crystal orientation properties in the a-b planes. It is conceivable that the values of the current flowing in the a-b planes were hence increased in the aforementioned samples, whereby it was possible to increase the critical current density values as hereinabove described.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of preparing an oxide superconducting thin film, comprising the steps of:
    preparing a non-single crystalline substrate;
    forming a plurality of grooves of from about 0.2 to about 100 μm in width and from about 0.05 to 100 μm in depth, extending in the same direction, on a surface of said substrate to be provided with an oxide superconducting thin films; and
    forming an oxide superconducting thin film on said surface by a vapor phase method.

2. A method of preparing an oxide superconducting thin film in accordance with claim 1, wherein said substrate is formed of a long material, and said grooves are formed to extend along the longitudinal direction of said substrate.

3. A method of preparing an oxide superconducting thin film in accordance with claim 1, wherein an average pitch between said plurality of grooves is selected to be not more than 10 μm.

4. A method of preparing an oxide superconducting thin film in accordance with claim 1, wherein said vapor phase method is laser ablation.

5. A method of preparing an oxide superconducting thin film in accordance with claim 1, wherein said grooves are formed by one of photolithography and beam application.

* * * * *